United States Patent [19]
Lee

[11] Patent Number: 5,970,380
[45] Date of Patent: Oct. 19, 1999

[54] METHODS OF FORMING SEMICONDUCTOR SWITCHING DEVICES HAVING SILICIDE REGIONS THEREIN

[75] Inventor: Chan-jo Lee, Seoul, Rep. of Korea

[73] Assignee: Samsung Electronics Co., Ltd., Rep. of Korea

[21] Appl. No.: 08/924,164

[22] Filed: Sep. 5, 1997

[30] Foreign Application Priority Data

May 20, 1997 [KR] Rep. of Korea ...................... 97-19559

[51] Int. Cl.$^6$ .................................................. H01L 21/44
[52] U.S. Cl. ............................................ 438/682; 438/597
[58] Field of Search .................................... 438/682, 597, 438/584, 683; 257/412, 384

[56] References Cited

U.S. PATENT DOCUMENTS

| | | | |
|---|---|---|---|
| 5,027,185 | 6/1991 | Liauh ........................................ | 357/59 |
| 5,545,578 | 8/1996 | Park et al. ................................. | 437/44 |
| 5,852,319 | 12/1998 | Kim et al. ................................. | 257/412 |
| 5,883,418 | 10/1995 | Kimura ..................................... | 257/412 |

*Primary Examiner*—Charles Bowers
*Assistant Examiner*—Craig Thompson
*Attorney, Agent, or Firm*—Myers Bigel Sibley & Sajovec

[57] ABSTRACT

Methods of forming semiconductor switching devices include the steps of separating refractory or group VIII metals to be used on electrodes and contact regions from each other, so that subsequent conversion of these metal layers to metal silicide layers will not result in the formation of silicide bridge defects ("shorts"). In particular, a method of forming a semiconductor switching device is provided that includes the steps of forming an electrode on a semiconductor substrate and then forming a first metal layer having a first thickness on the electrode. A contact region of first conductivity type is also formed in the semiconductor substrate and then a second metal layer having a second thickness, less than the first thickness, is formed on the contact region. The first and second metal layers are then simultaneously converted to first and second metal silicide layers using a thermal treatment step. Moreover, prior to performing the conversion step, the first and second metal layers are electrically insulated from each other to prevent the likelihood of formation of bridge defects which may result when residues of metal silicide are formed on the substrate. In addition, the thicknesses of each of the metal layers is preferably chosen so that careful control of the final thicknesses of the metal silicide layers can be obtained to optimize the electrical characteristics of the switching device.

18 Claims, 3 Drawing Sheets

METHODS OF FORMING SEMICONDUCTOR SWITCHING DEVICES HAVING SILICIDE REGIONS THEREIN

FIELD OF THE INVENTION

The present invention relates to methods of forming semiconductor devices and devices formed thereby.

BACKGROUND OF THE INVENTION

As the degree of integration in semiconductor circuits increases, there is a concomitant need to develop semiconductor devices with high operation speed and low power consumption. To provide such devices having these excellent characteristics, it is necessary to ensure low contact resistance. As the contact dimensions of semiconductor devices shrink, however, the contact resistance typically increases, and in addition, the sheet resistivity of the shallow-junctions of the diffused regions also increases.

To reduce these resistance values, one widely used and relatively simple technique is typically referred to as self-aligned silicide (salicide). According to the salicide technique, a transition metal such as Ti, Ta or Mo is deposited over a MOS structure, and reacted with the exposed Si areas of the source and drain as well as the exposed poly-Si areas on the gate by thermal treatment, to form a silicide. During the silicide formation, oxide spacers are used to prevent the gate and source/drain regions from being electrically connected by avoiding silicide formation on these oxide spacers. After the silicide formation, a selective etch removes the unreacted transition metal without attacking the silicide, the silicon substrate or the oxide spacers. As a result, each exposed source/drain region and poly-Si gate is covered by a silicide layer.

Unfortunately, this technique has drawbacks because of a bridging effect. The bridging effect occurs because silicon from within the oxide spacers diffuses into the metal layer, e.g., Ti layer, that covers the oxide spacers and subsequently reacts with the Ti during the thermal treatment process for the silicide formation. Thus, unwanted reaction of metal with the oxide spacers results in the lateral formation of silicide which can easily bridge the separation between the gate and the source/drain regions. Also, because unreacted metal may not be totally removed by the selective etching process and may remain over the substrate additional bridging may also take place. Consequently, unwanted silicide and remaining metal can cause the gate to become shorted to the source/drain regions.

SUMMARY OF THE INVENTION

It is therefore an object of the present invention to provide improved methods of forming semiconductor switching devices.

It is another object of the present invention to provide methods of forming semiconductor switching devices having low resistance electrodes and contact regions therein.

It is still another object of the present invention to provide methods of forming semiconductor switching devices having silicide layers therein.

It is a further object of the present invention to provide methods of forming semiconductor switching devices that are less susceptible to bridging defects.

These and other objects, features and advantages of the present invention are provided by methods of forming semiconductor switching devices which include the steps of separating refractory or group VIII metals to be used on electrodes and contact regions from each other, so that subsequent conversion of these metal layers to metal silicide layers will not result in the formation of silicide bridge defects ("shorts"). According to a preferred embodiment of the present invention, a method of forming a semiconductor switching device is provided that includes the steps of forming an electrode on a semiconductor substrate and then forming a first metal layer having a first thickness on the electrode. A contact region of first conductivity type is also formed in the semiconductor substrate and then a second metal layer having a second thickness, less than the first thickness, is formed on the contact region. The first and second metal layers are then simultaneously converted to first and second metal silicide layers using a thermal treatment step. Moreover, prior to performing the conversion step, the first and second metal layers are electrically insulated from each other to prevent the likelihood of formation of bridge defects which may result when residues of metal silicide are formed on the substrate. In addition, the thicknesses of each of the metal layers is preferably chosen so that careful control of the final thicknesses of the metal silicide layers can be obtained to optimize the electrical characteristics of the switching device.

According to another embodiment of the present invention, methods of forming insulated gate field effect transistor are provided that include the steps of forming a gate oxide insulating layer on a face of semiconductor substrate and then forming a gate electrode on the gate oxide insulating layer. A first refractory or group VIII metal layer having a first thickness is then formed on the gate electrode. An electrically insulating capping layer may also be formed on the first metal layer, opposite the gate electrode. First dopants of first conductivity type are then implanted into the substrate to form lightly doped source and drain regions. A second refractory or group VIII metal layer having a second thickness less than the first thickness, is then formed on the source and drain regions. Here, the formation of the capping layer prevents the formation of an electrical connection between the first and second metal layers. The first and second metal layers are then converted simultaneously to first and second metal silicide layers, respectively, which are electrically disconnected from each other even if residues of the second metal silicide layer remain after an etching step to remove unreacted metal.

DESCRIPTION OF PREFERRED EMBODIMENTS

Figure 1:
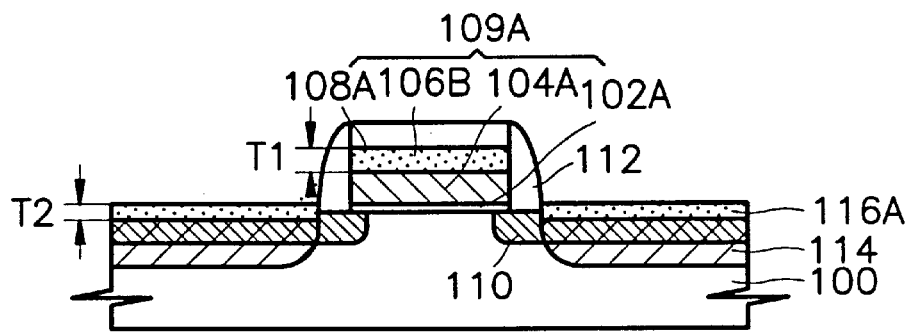
FIG. 1 illustrates a cross-section of a semiconductor switching device according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Moreover, the terms "first conductivity type" and "second conductivity type" refer to opposite conductivity types such as N-type and P-type or vice versa. It will also be understood that when a layer is referred to as being "on" another layer or substrate, it can be directly on the other layer or substrate, or intervening layers may also be present. Like numbers refer to like elements throughout.

Referring now to FIG. 1, a switching device according to a preferred embodiment will be described. As shown, a substrate 100 includes a stacked gate structure 109A consisting of gate oxide pattern 102A, a conductive pattern 104A such as polysilicon layer pattern, a first silicide layer pattern 106B having a first thickness T1 and an insulating layer pattern 108A on a face of the substrate 100. A sidewall spacer 112 is formed at the edges of the stacked gate structure 109A. Source and drain regions 110 and 114 are also formed on a face of the substrate 100. A second silicide layer pattern 116A having a second thickness T2 is also formed on the source/drain regions 110 and 114. In particular, the first silicide layer pattern 106B on the conductive layer pattern 104A and the second silicide layer patterns 116A on the source/drain regions 110 and 114 are electrically insulated from each other by the insulating layer pattern 108A and the spacer 112. The insulating layer pattern 108A is preferably formed of a material that can function as an effective electrical insulator. Thus, even if some unwanted silicide and unreacted metal remains on the sidewall spacer 112 after the selective etching step, the conductive layer pattern 104A and the first silicide layer pattern 106B thereon are not shorted to the source/drain regions 110 and 114 and the second silicide layer pattern 116A thereon. It is preferable that the first and the second silicide layer patterns 106B and 116A comprise group-VIII metal silicide materials, such as $CoSi_2$, $NiSi_2$, $Pd_2Si$ and $PtSi$ or refractory metal silicides such as $WSi_2$, $TiSi_2$, $TaSi_2$ and $MoSi_2$.

In addition, it is desirable that the first thickness T1 of the first silicide layer pattern 106B on the conductive layer pattern 104A is thicker than the second thickness T2 of the second silicide layer pattern 116A on the source/drain regions 110 and 114. The reason is that thicker silicide layer is favorable at the gate level to have the lowest possible sheet resistance whereas the silicide layer over the source/drain region should be of limited thickness to prevent excess consumption of the substrate 100 silicon by suicide formation. Thus, according to the present invention, the two silicide layer patterns of different thickness and the insulating layer pattern which prevents electrical connection of the conductive layer pattern and the source/drain regions, allow the switching device to posses low resistance and stable operation.

Figure 2:
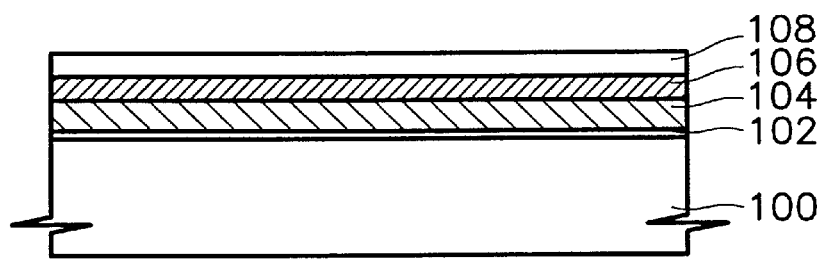
FIGS. 2–7 are cross-sectional views of intermediate structures that illustrate a method of forming the semiconductor switching device of FIG. 1 according to another embodiment of the present invention.

FIGS. 2–7 illustrate sectional views of the switching device of FIG. 1 during intermediate fabrication steps. As shown in FIG. 2, a gate oxide layer 102, a conductive layer 104 such as polysilicon layer, a first metal layer 106 and an insulating layer 108 are formed sequentially on a face of the semiconductor substrate 100 to thicknesses of 50–80 Å, 800–1500 Å, 400–500 Å and 1000–1500 Å, respectively. The first metal layer 106 is preferably formed of group-VIII metal or refractory metal. For example, Ti, W, Mo, Ta, Co, Ni, Pd or Pt may be used. Preferably, the insulating layer 108 is made of material that can effectively separate the gate structure from the source/drain regions. Thus, low temperature oxide or silicon nitride may be used.

Figure 3:
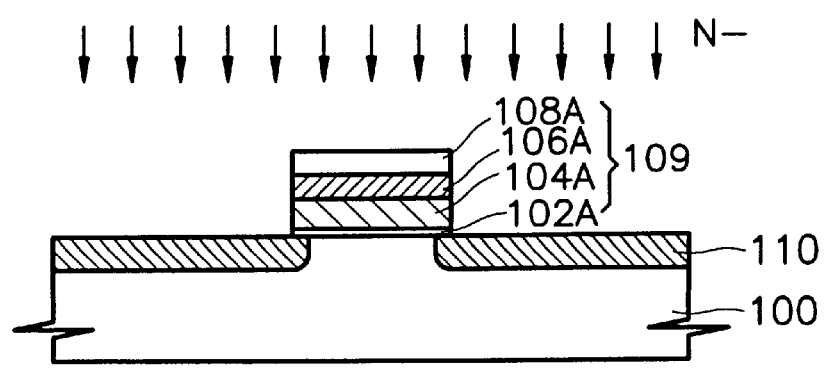

Referring now to FIG. 3, a stacked gate structure 109, consisting of gate oxide pattern 102A, a conductive layer pattern 104A, a first silicide pattern 106A and an insulating layer pattern 108A, is formed by sequentially patterning the gate oxide layer 102, a conductive layer 104, a first metal layer 106 and an insulating layer 108. A light dose of ⁻dopants are implanted into the substrate 100 using the stacked gate structure 109 as an implantation mask to form the lightly doped region 110. The dopants are preferably implanted at dose levels in a range from about $5\times10^{12}$ to $1\times10^{13}$ $cm^{-2}$ and at energies of 40–60 keV.

Figure 4:
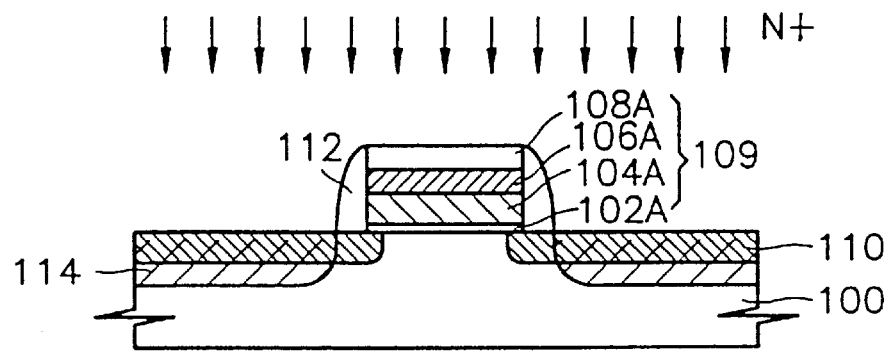

FIG. 4 illustrates formation of a sidewall spacers 112 and heavily doped region 114. An insulating layer (not shown) for forming the sidewall spacer 112 is deposited on the overall surface of the semiconductor substrate of FIG. 3. The insulating layer for the spacers may comprise low temperature oxide or silicon nitride. The sidewall spacers 112 are then formed by etching the insulating layer for the spacer. The sidewall spacers 112 extend from the bottom of the gate oxide pattern 102A to the upper side of the insulating layer pattern 108A. Next, $N^+$ dopants are implanted at a dose level of about $5\times10^{15}$ $cm^{-2}$ or higher and at energies of 40–80 keV, using the sidewall spacers 112 as an implant mask, to form the heavily doped region 114, that results in LDD source/drain regions 110 and 114.

Figure 5:
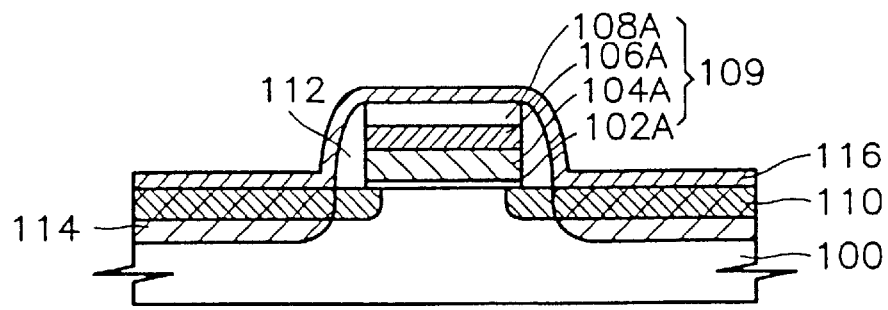

Referring to FIG. 5, a second metal layer 116 having a thickness in the range between 300–350 Å is then deposited on the entire surface of the substrate 100. The second metal layer 116 is preferably formed of group-VIII metal or refractory metal. For example, Ti, W, Mo, Ta, Co, Ni, Pd or Pt may be used. It is also preferable that the second metal layer 116 is formed to be thinner than the first metal layer 106 so that the silicide layer to be formed on the gate low sheet resistance and the silicide layer to be formed over the source/drain regions consumes less the silicon substrate during the silicide formation.

Figure 6:
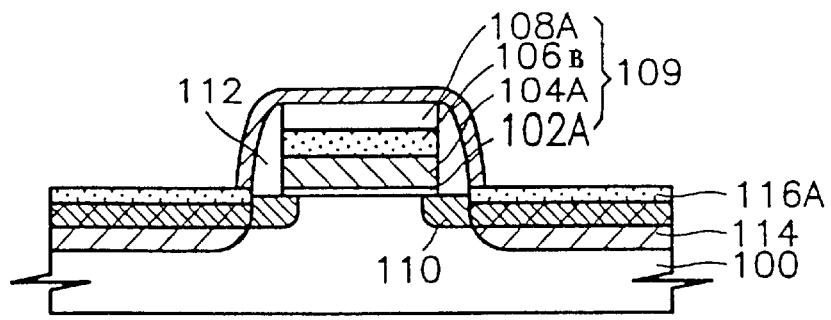

Referring to FIG. 6, the substrate 100 having the second metal layer 116 thereon is heated, that causes the silicide reaction to occur wherever the first metal layer pattern 106A and the second metal layer 116 is in contact with the silicon. As a result, the first silicide layer pattern 106B having a thickness in a range of about 700 Å–800 Å and the second silicide layer pattern 116A having thickness in the range of about 500–600 521 , are formed on the conductive layer pattern 104A and the LDD source/drain regions 110 and 114, respectively. At this time, the first metal layer pattern 106A may be wholly converted into silicide layer pattern 106B or the first metal layer pattern 106A may be only partially converted into silicide layer pattern 106B.

Figure 7:
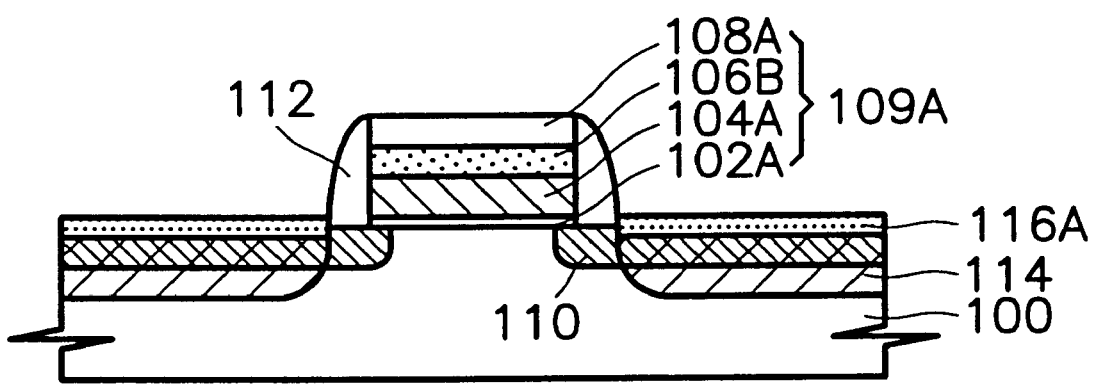

Following the silicide reaction, as shown in FIG. 7, the unreacted metal is selectively removed through the use of an etchant that does not attack the first and the second silicide layer patterns 106B and 116A, the insulating layer pattern 108A, sidewall spacer 112 or the substrate 100. Thus, the conductive layer pattern 104A and the exposed source/drain regions 110 and 114 are covered by the first and the second silicide layer patterns 106B and 116A, respectively.

In summary, the present invention allows for the improvement of the electrical characteristics of a switching device by using silicide and by using an insulating layer pattern that effectively avoids the shorts between the gate and the source/drain regions even though some unwanted silicide and unreacted metal remains on the sidewall spacer and over the substrate. Thus, the fabrication methods for the switching device according to the present invention may have wide processing margins.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a semiconductor switching device, comprising the steps of:

forming an electrode on a semiconductor substrate;

forming a first metal layer having a first thickness on the electrode;

forming a semiconductor contact region in the semiconductor substrate, adjacent the electrode;

forming a second metal layer having a second thickness less than the first thickness, on the contact region; and converting the first and second metal layers simultaneously to a first and a second metal silicide layer, respectively.

2. The method of claim 1, wherein said step of forming a second metal layer is preceded by the step of forming an electrically insulating capping layer on the first metal layer, opposite the electrode.

3. The method of claim 2, wherein said step of forming a second metal layer comprises forming a second metal layer on the contact region and on the electrically insulating capping layer.

4. The method of claim 3, wherein said step of forming a contact region comprises implanting dopants into the semiconductor substrate, using the electrically insulating capping layer as an implant mask.

5. The method of claim 4, further comprising the steps of forming an electrically insulating spacer layer on the electrically insulating capping layer and on the contact region; and etching the electrically insulating spacer layer to define an electrically insulating spacer at a sidewall of the electrode.

6. The method of claim 5, wherein said step of forming a second metal layer comprises forming a second metal layer on the contact region, electrically insulating spacer and electrically insulating capping layer.

7. The method of claim 6, wherein said step of forming a second metal layer is preceded by the step of implanting dopants into the contact region, using the electrically insulating spacer as an implant mask.

8. The method of claim 7, wherein said step of forming a first metal layer comprises depositing a metal selected from the group consisting of group VIII and refractory metals and having a thickness in a range between about 400–500 Å, on the electrode; and wherein said second metal layer forming step comprises depositing a metal selected from the group consisting of group VIII and refractory metals and having a thickness in a range between about 300–350 Å, on the contact region.

9. The method of claim 8, wherein said converting step comprises converting the first and second metal layers to the first and second metal silicide layers having thicknesses in ranges between about 700–800 Å and 500–600 Å, respectively.

10. A method of forming an insulated gate field effect transistor, comprising the steps of:

forming a gate oxide insulating layer on a face of semiconductor substrate;

forming a gate electrode on the gate oxide insulating layer;

forming a first metal layer having a first thickness on the gate electrode;

forming an electrically insulating capping layer on the first metal layer, opposite the gate electrode;

implanting first dopants into the substrate to form source and drain regions;

forming a second metal layer having a second thickness less than the first thickness, on the source and drain regions; and converting the first and second metal layers simultaneously to a first and a second metal silicide layer, respectively.

11. The method of claim 10, wherein said step of forming a second metal layer comprises forming a second metal layer on the source and drain regions and on the electrically insulating capping layer.

12. The method of claim 4, further comprising the steps of forming an electrically insulating spacer layer on the electrically insulating capping layer and on the source and drain regions; and etching the electrically insulating spacer layer to define an electrically insulating spacer at a sidewall of the gate electrode.

13. The method of claim 12, wherein said step of forming a second metal layer comprises forming a second metal layer on the source and drain regions, electrically insulating spacer and electrically insulating capping layer.

14. The method of claim 13, wherein said step of forming a second metal layer is preceded by the step of implanting second dopants having the same conductivity type as the first dopants into the source and drain regions, using the electrically insulating spacer as an implant mask.

15. The method of claim 14, wherein said step of forming a first metal layer comprises depositing a metal selected from the group consisting of group VIII and refractory metals and having a thickness in a range between about 400–500 Å, on the gate electrode; and wherein said second metal layer forming step comprises depositing a metal selected from the group consisting of group VIII and refractory metals and having a thickness in a range between about 300–350 Å, on the source and drain regions.

16. The method of claim 15, wherein said converting step comprises converting the first and second metal layers to the first and second metal silicide layers having thicknesses in ranges between about 700–800 Å and 500–600 Å, respectively.

17. The method of claim 16, wherein said step of implanting first dopants comprises implanting first dopants at a dose level in a range between about $5\times10^{12}$ cm$^{-2}$ and $1\times10^{13}$ cm$^{-2}$; and wherein said step of implanting second dopants comprises implanting second dopants at a dose level greater than about $5\times10^{15}$ cm$^{-2}$.

18. The method of claim 16, further comprising the step of etching residues of the second metal layer from the electrically insulating spacer.

* * * * *